United States Patent
Ogiwara et al.

(10) Patent No.: US 7,795,953 B2
(45) Date of Patent: Sep. 14, 2010

(54) VOLTAGE STEP-DOWN CIRCUIT

(75) Inventors: Ryu Ogiwara, Yokohama (JP);
Shinichiro Shiratake, Yokohama (JP);
Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 198 days.

(21) Appl. No.: 12/051,465

(22) Filed: Mar. 19, 2008

(65) Prior Publication Data
US 2008/0231351 A1 Sep. 25, 2008

(30) Foreign Application Priority Data
Mar. 20, 2007 (JP) ............... 2007-073448

(51) Int. Cl.
*G05F 1/10* (2006.01)
(52) U.S. Cl. ...................... 327/541; 327/538
(58) Field of Classification Search ................ 327/538, 327/540, 541
See application file for complete search history.

(56) References Cited

U.S. PATENT DOCUMENTS 5,811,861 A * 9/1998 Nunokawa .................. 257/379
6,184,744 B1 * 2/2001 Morishita ................... 327/541
6,768,370 B2 * 7/2004 Takahashi et al. ........... 327/540
7,307,469 B2 * 12/2007 Yamada et al. .............. 327/540
7,468,624 B2 * 12/2008 Yamada et al. .............. 327/540

FOREIGN PATENT DOCUMENTS

JP       2000-200483       7/2000

* cited by examiner

*Primary Examiner*—Hai L Nguyen
(74) *Attorney, Agent, or Firm*—Oblon, Spivak, McClelland, Maier & Neustadt, L.L.P.

(57) ABSTRACT

According to an aspect of the present invention, there is provided a voltage step-down circuit including: a first NMOS connected between an external and an internal power-supply voltages through a PMOS turned ON during an active state and turned OFF during a standby state; a second NMOS connected between the external and the internal power-supply voltages; and a current control circuit that sinks a current from the internal power-supply voltage to a ground level for a certain period of time after an operation state is switched from the active state to the standby state.

12 Claims, 10 Drawing Sheets

101: CURRENT CONTROL CIRCUIT

VOLTAGE STEP-DOWN CIRCUIT

CROSS-REFERENCE TO RELATED APPLICATIONS

The entire disclosure of Japanese Patent Application No. 2007-073448 filed on Mar. 20, 2007 including specification, claims, drawings and abstract is incorporated herein by reference in its entirety.

BACKGROUND OF THE INVENTION

1. Field of the Invention

An aspect of the present invention relates to a voltage step-down circuit in a semiconductor memory.

2. Description of the Related Art

In the semiconductor devices such as the semiconductor memory, or the like, for the purpose of compatibility between the finer patterning in manufacturing processes and the standardization of a power supply voltage, a plurality of voltage step-down circuits for converting a power supply voltage supplied from the outside into internal power supply voltages suitable for applied manufacturing processes respectively are used nowadays (see JP-A-2000-200483, for example).

As the voltage step-down circuit, various circuit configurations are used. The voltage step-down circuit generates the internal power supply voltage from the power supply voltage and operates in both an active state for supplying a large current to a load circuit, such as a memory, and a standby state for suppressing the current supplied to the load circuit. As one configuration, there is the circuit configuration equipped with a source follower type transistor (Tract) operated only in the active state and a source follower type transistor (Trstby) operated in both the standby state and the active state. In such voltage step-down circuit, it has been considered conventionally that a current is supplied from the power supply voltage to the internal power supply voltage mainly by Tract in the active state whereas only by Trstby in the standby state.

However, when an operating state of the voltage step-down circuit is switched from the active state to the standby state, the charges that are accumulated in an inversion layer and a drain region of Tract that is larger than Trstby flow into the internal power supply voltage, and thus another current supply source is generated in the standby state in addition to Trstby. Therefore, such a problem has arisen that an extra voltage rise is brought about in the standby state. Since this phenomenon takes place every time when the operating state is switched from the active state to the standby state, such a problem has arisen that a greater voltage variation is generated as the operating state is switched at a higher cycle.

SUMMARY OF THE INVENTION

According to an aspect of the present invention, there is provided a voltage step-down circuit including: an input terminal to which an external power-supply voltage is input; an output terminal from which an internal power-supply voltage that is lower than the external power-supply voltage is output; a first PMOS that is connected to the input terminal and is turned ON during an active state and turned OFF during a standby state; a first NMOS having: a drain that is connected to the input terminal through the first PMOS, a gate to which a control voltage is input, and a source that is connected to the output terminal; a second NMOS having: a drain that is connected to the input terminal, a gate to which the control voltage is input, and a source that is connected to the output terminal; and a current control circuit that sinks a control current from the output terminal to a ground level for a certain period of time after an operation state is switched from the active state to the standby state.

According to another aspect of the present invention, there is provided a voltage step-down circuit including: a first transistor that steps-down an external power-supply voltage into an internal power-supply voltage during an active state; a second transistor that steps-down the external power-supply voltage into the internal power-supply voltage during an standby state; and a current control circuit that sinks a control current from the internal power-supply voltage to a ground level when an operation state is switched from the active state to the standby state.

BRIEF DESCRIPTION OF THE DRAWINGS

Embodiments may be described in detail with reference to the accompanying drawings, in which.

DETAILED DESCRIPTION OF THE INVENTION

Embodiments of the present invention will be explained with reference to the drawings hereinafter.

First Embodiment

Figure 1:
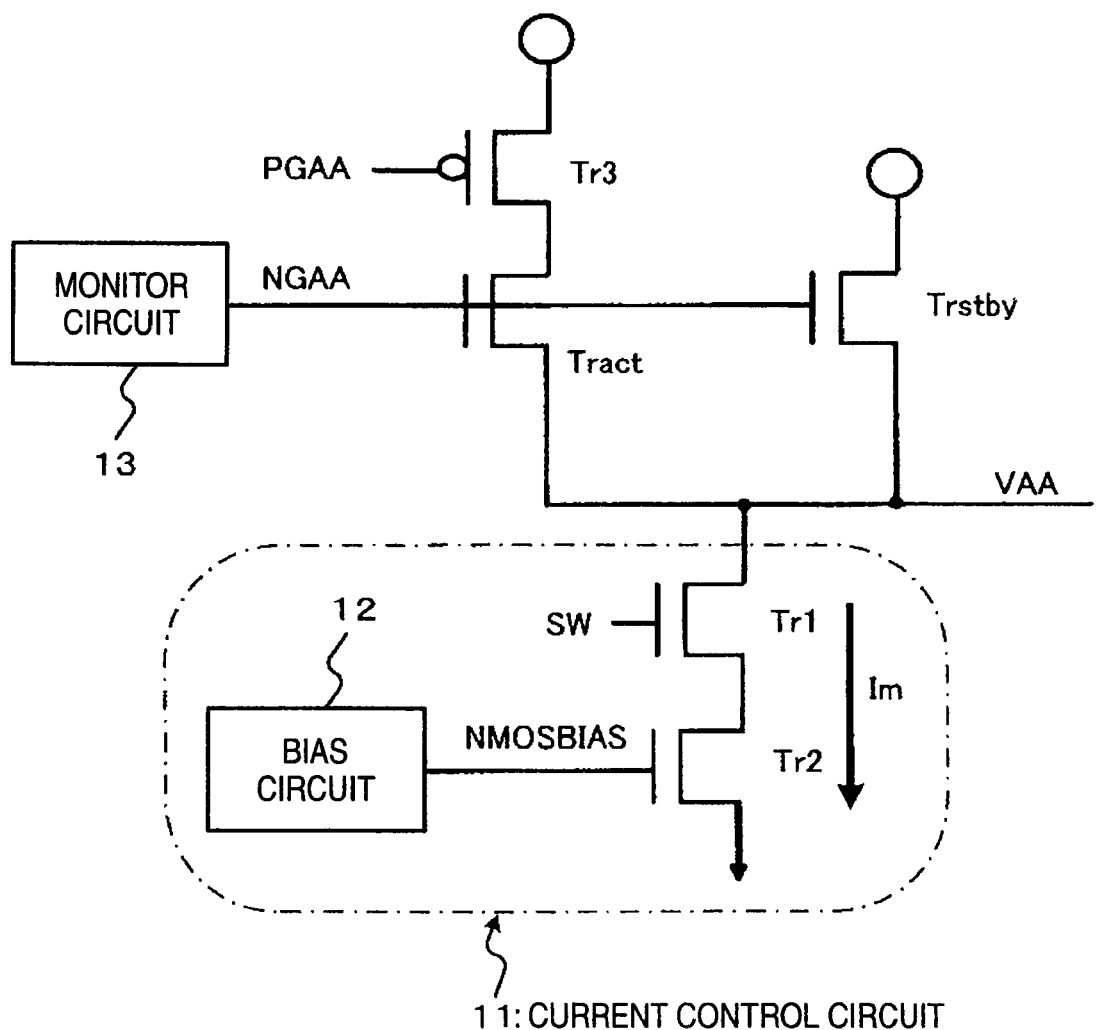
FIG. 1 is a circuit diagram showing a voltage step-down circuit according to a first embodiment.

FIG. 1 is a circuit diagram showing a voltage step-down circuit according to a first embodiment. The voltage step-down circuit according to the first embodiment includes a p-type MOS transistor (abbreviated as a "PMOS" hereinafter) Tr3, step-down transistors Tract and Trstby controlled by a control voltage NGAA that is input into their gates, a monitor circuit 13 for generating the control voltage NGAA, and a current control circuit 11 for sinking a control current Im from an internal power supply voltage VAA to a ground voltage GND.

Tract has a size larger than that of Trstby. When Tr3 is turned ON, the voltage step-down circuit becomes in an active state for supplying a large current to a load circuit through Tract. When Tr3 is turned OFF, the voltage step-down circuit becomes in a standby state for suppressing the current supplied to the load circuit.

As shown in FIG. 1, the current control circuit 11 has an n-type MOS transistor (abbreviated as an "NMOS" hereinafter) Tr1 that is turned ON for a certain period of time after the operating state is switched, an NMOS Tr2 controlled by a bias voltage NMOSBIAS that is input into its gate, and a bias circuit 12 for generating the bias voltage NMOSBIAS.

A source of Tr3 is connected to a power supply voltage VDD supplied from the external device, and a signal PGAA indicating the active state is input into a gate of Tr3. Tr3 is turned ON by PGAA when the operating state is the active state. Also, a drain of Tract is connected to a drain of Tr3, NGAA is input into a gate of Tract from the monitor circuit 13, and a source of Tract is connected to VAA.

A drain of Trstby is connected to VDD, NGAA is input into a gate of Trstby, and a source of Trstby is connected to VAA. An input of the current control circuit 11 is connected to VAA.

A drain of Tr1 is connected to VAA as an input of the current control circuit 11, and a signal SW indicating the switching of the operating state is connected to a gate of Tr1. Tr1 is turned ON by SW for a certain period of time after the operating state is switched from the standby state to the active state. Also, NMOSBIAS as an output of the bias circuit 12 is connected to a gate of Tr2, and a source of Tr2 is connected to GND.

This NMOSBIAS that the bias circuit 12 outputs is a voltage that is in proportion to a difference (VDD−VAA) between VDD and VAA, and as a result the Im flowing through Tr2 is in proportion to (VDD−VAA). A configuration of the bias circuit 12 will be described later by reference to FIG. 3.

The step-down transistors Tract and Trstby are NMOSs. The drain of Tract is connected to VDD through Tr3, and VDD is supplied to the drain of Tract only when Tr3 is turned ON.

A gate width Wact of Tract and a gate width Wstby of Trstby are set to satisfy $$Iact/Istby=Wact/Wstby,$$

where Iact is an operating current flowing into the load circuit (not shown) connected to VAA in the active state, and Istby is the operating current in the standby state.

To suppress a variation of the internal power supply voltage VAA, Wact and Wstby are set to make the operation current per unit gate width in both the active state and the standby state equal.

NGAA being input into the gates of Tract and Trstby is a constant voltage that is controlled in 16 levels according to trimming addresses Add.0 to Add.15. This NGAA stabilizes VAA in a certain range, irrespective of a current consumption in the load circuit connected to VAA.

Figure 2:
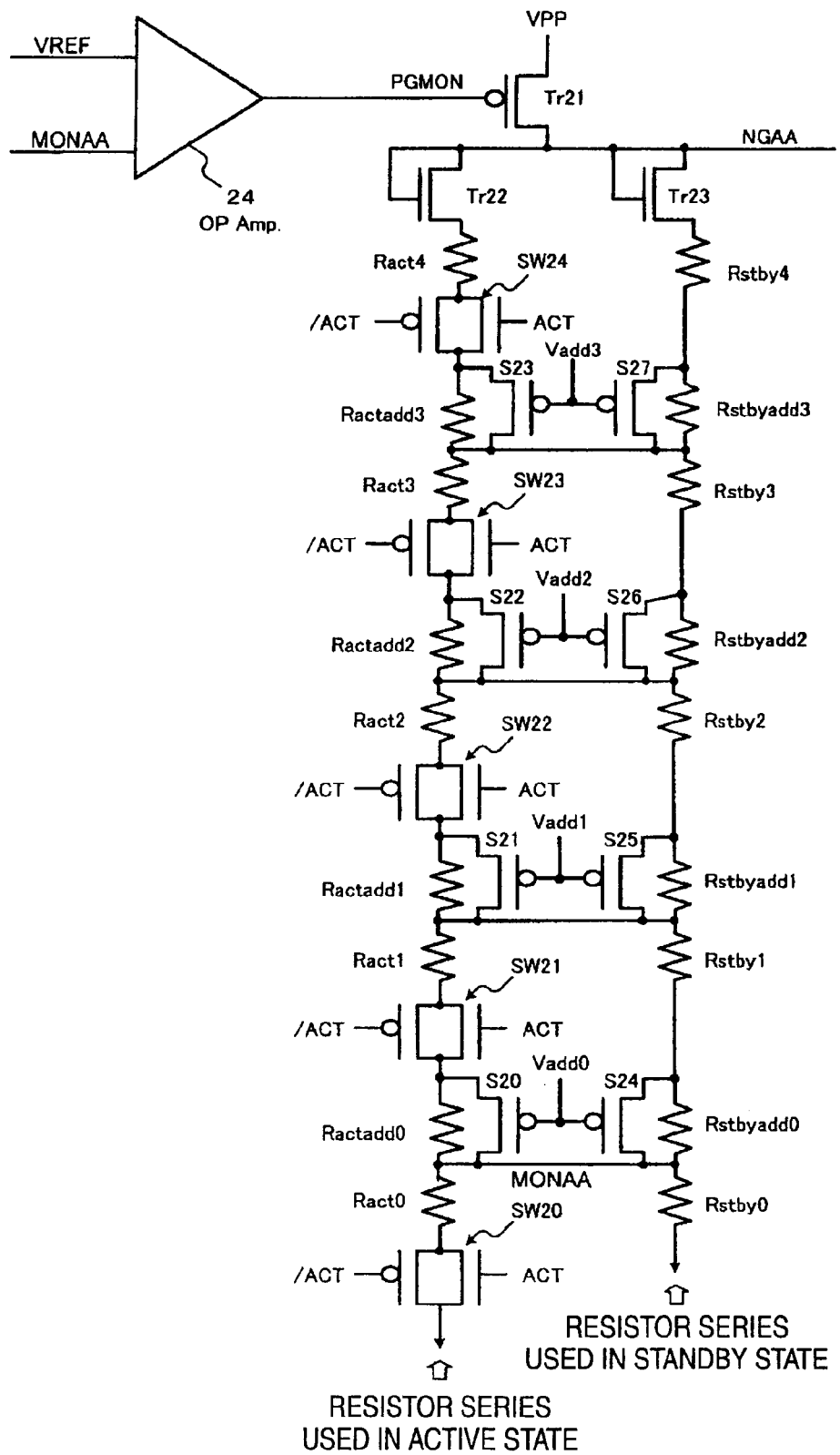
FIG. 2 is a circuit diagram showing a monitor circuit 13 that generates NGAA, in the voltage step-down circuit according to the first embodiment.

FIG. 2 is a circuit diagram showing the monitor circuit 13 for generating NGAA, in the voltage step-down circuit according to the first embodiment. In the voltage step-down circuit according to the first embodiment, the monitor circuit 13 includes a current controlling transistor Tr21 of PMOS, mirror transistors Tr22 and Tr23 of NMOS, an operational amplifier 24, nine resistors Rstby0 to Rstby4 and Trsbyadd0 to Trsbyadd3 through which a current flows in both the active state and the standby state, nine resistors Ract0 to Ract4 and Ractadd0 to Ractadd3 through which a current flows in the active state, PMOS switches S20 to S27 connected in parallel with Ractadd0 to Ractadd3 and Rstbyadd0 to Rstbyadd3 respectively, and five switching elements SW20 to SW24.

SW20 to SW24 are constructed by connecting NMOS and PMOS in parallel respectively. A signal ACT indicating the active state is input into a gate of NMOS, and a complementary signal /ACT of ACT is input into a gate of PMOS.

S20 to S27 are of PMOS. A trimming signal Vadd0 is input into gates of S20 and S24, a trimming signal Vadd1 is input into gates of S21 and S25, a trimming signal Vadd2 is input into gates of S22 and S26, and a trimming signal Vadd3 is input into gates of S23 and S27.

A source of Tr21 is connected to a word line step-up voltage VPP, a monitor signal PGMON is input into a gate of Tr21 from the operational amplifier 24, and a drain of Tr21 is connected to gates of Tract and Trstby as the output NGAA of the monitor circuit 13 shown in FIG. 1.

A drain and a gate of Tr22 are connected to NGAA, one end of Ract4 is connected to a source of Tr22, the other end of Ract4 is connected to one end of SW24, the other end of SW24 is connected to one end of Ractadd3 and a source of S23, and the other end of Ractadd3 is connected to one end of Ract3 and a drain of S23.

The other end of Ract3 is connected to one end of SW23, the other end of SW23 is connected to one end of Ractadd2 and a source of S22, and the other end of Ractadd2 is connected to one end of Ract2 and a drain of S22.

The other end of Ract2 is connected to one end of SW22, the other end of SW22 is connected to one end of Ractadd1 and a source of S21, and the other end of Ractadd1 is connected to one end of Ract1 and a drain of S21.

The other end of Ract1 is connected to one end of SW21, the other end of SW21 is connected to one end of Ractadd0 and a source of S20, the other end of Ractadd0 is connected to one end of Ract0 and a drain of S20, the other end of Ract0 is connected to one end of SW20, and the other end of SW20 is connected to GND.

A drain and a gate of Tr23 are connected to NGAA. One end of Rstby4 is connected to a source of Tr23, the other end of Rstby4 is connected to one end of Rstbyadd3 and a source of S27, and the other end of Rstbyadd3 is connected to one end of Rstby3, a drain of S27, and the one end of Ract3.

The other end of Rstby3 is connected to one end of Rstbyadd2 and a source of S26, and the other end of Rstbyadd2 is connected to one end of Rstby2, a drain of S26, and the one end of Ract2.

The other end of Rstby2 is connected to one end of Rstbyadd1 and a source of S25, and the other end of Rstbyadd1 is connected to one end of Rstby1, a drain of S25, and the one end of Ract1.

The other end of Rstby1 is connected to one end of Rstbyadd0 and a source of S24, and the other end of Rstbyadd0 is connected to one input of the operational amplifier 24 as the monitor voltage MONAA, one end of Rstby0, a drain of S24, and the one end of Ract0, and the other end of Rstby0 is connected to GND.

A reference voltage VREF produced by a BGR (Band Gap Reference) circuit is input into the other input of the operational amplifier 24. An output of the operational amplifier 24 is connected to the gate of Tr21 as PGMON.

An operation of the monitor circuit 13 will be explained hereunder. When MONAA is lower than VREF, an output PGMON of the operational amplifier 24 becomes to "Low", Tr21 is turned ON, and a voltage is supplied to the resistor series. Thus, MONAA rises, the gate voltages NGAA of Tract and Trstby rise, and then VAA rises.

When MONAA is higher than VREF, PGMON becomes to "High", Tr21 is turned OFF, and a voltage is not supplied to the resistor series. Thus, MONAA falls, the gate voltages NGAA of Tract and Trstby fall, and then VAA falls.

In this manner, Tr21 is ON/OFF-controlled by the operational amplifier 24 based on MONAA to control the gate voltages NGAA of Tract and Trstby, thereby maintaining VAA constant.

SW20 to SW24 are inserted into the resistor series used in the active state, and are controlled by ACT such that these elements are turned ON only in the active state. As a result, a current consumption in the standby state can be reduced.

Resistance values of Ract0 to Ract4 and Rstby0 to Rstby4 are set to satisfy $Ract0:Ract1:Ract2:Ract3:Ract4 = Rstby0:Rstby1:Rstby3:Rstby4,$ and $Wmact/Wmstby = Ract0 / Rstby0$
$= Ract1 / Rstby1$
$= Ract2 / Rstby2$
$= Ract3 / Ract3$
$= Ract4 / Rstby4$ where Wmact is a gate width of Tr22, and Wmstby is a gate width of Tr23. As a result, when Ractadd0 to Ractadd3 and Rstbyadd0 to Rstbyadd3 are short-circuited by S20 to S27, the source voltages of Tract and Trstby can be made equal in both the active state and the standby state.

Also, the gate widths Wmact and Wmstby of the mirror transistors Tr22 and Tr23 are set to satisfy $Wact/Wmact=Iact/Iract$, and $Wstby/Wmstby=Istby/IRstby$ where IRact is a current value flowing through the resistor series (Ract0 to Ract4 and Ractadd0 to Ractadd3) used in the active state, and IRstby is a current value flowing through the resistor series (Rstby0 to Rstby4 and Rstbyadd0 to Rstbyadd3) used in the standby state. As a result, the source voltages of the step-down transistors (Tract, Trstby) and the mirror transistors (Tr22, Tr23) can be made equal in both the standby state and the active state.

In the standby state, a current flow through only Rstby0 to Rstby4, and only Trstby out of the step-down transistors operates. In the active state, Ract0 to Ract4 and Tract also operate, in addition to Rstby0 to Rstby4 and Trstby. That is, both two systems of the resistor series and the step-down transistors in the monitor circuit 13 operate in the active state. In this event, values of the resistors are set to satisfy following relationships $Rstby0 \gg Ract0,$ $Rstby1 \gg Ract1,$ $Rstby2 \gg Ract2,$ $Rstby3 \gg Ract3,$ $Rstby4 \gg Ract4,$ and $Wact \gg Wstby.$ Therefore, in considering the operation in the active state, only Ract0 to Ract4 and Ractadd0 to Ractadd3 should be taken into consideration as the resistor series of the monitor circuit 13, and also only Tract should be taken into consideration as the step-down transistor.

In contrast, in considering the operation in the standby state, only Rstby0 to Rstby4 and Rstbyadd0 to Rstbyadd3 should be taken into consideration as the resistor series of the monitor circuit 13, and also only Trstby should be taken into consideration as the step-down transistor.

As a result, for example, when Ractadd0 to Ractadd3 and Rstbyadd0 to Rstbyadd3 are short-circuited by S20 to S27, VAA is given by $VAAact=VREF\times(Ract0+R2act)/Ract0,$ and $VAAstby=VREF\times(Rstby0+R2stby)/Rstby0$ where $R2act=Ract1+Ract2+Ract3+Ract4,$ and $R2stby=Rstby1+Rstby2+Rstby3+Rstby4.$ Next, operations of Ractadd0 to Ractadd3 and Ractadd0 to Ractadd3 will be explained hereunder. S20 to S27 are controlled by the trimming signals Vadd0 to Vadd3 generated based on the trimming addresses Add.0 to Add.15. Relationships between Add.0 to Add.15 and Vadd0 to Vadd3 being input into the gates of S20 to S27 are given as follows.

TABLE 1

|        | Vadd0 | Vadd1 | Vadd2 | Vadd3 |
|--------|-------|-------|-------|-------|
| Add.0  | Low   | Low   | Low   | Low   |
| Add.1  | High  | Low   | Low   | Low   |
| Add.2  | Low   | High  | Low   | Low   |
| Add.3  | High  | High  | Low   | Low   |
| Add.4  | Low   | Low   | High  | Low   |
| Add.5  | High  | Low   | High  | Low   |
| Add.6  | Low   | High  | High  | Low   |
| Add.7  | High  | High  | High  | Low   |
| Add.8  | Low   | Low   | Low   | High  |
| Add.9  | High  | Low   | Low   | High  |
| Add.10 | Low   | High  | Low   | High  |
| Add.11 | High  | High  | Low   | High  |
| Add.12 | Low   | Low   | High  | High  |
| Add.13 | High  | Low   | High  | High  |
| Add.14 | Low   | High  | High  | High  |
| Add.15 | High  | High  | High  | High  |

Resistance values of Ractadd0 to Ractadd3 are set to satisfy $Ractadd0:Ractadd1:Ractadd2:Ractadd3=2^0:2^1:2^2:2^3.$ Resistance values of Rstbyadd0 to Rstbyadd3 are set to satisfy $Rstbyadd0:Rstbyadd1:Rstbyadd2:Rstbyadd3=2^0:2^1:2^2:2^3.$ Because respective resistance values are set in this manner, a different voltage can be generated as VAA in 16 levels in all. That is, VAA in the active state can be trimmed in 16 levels of $VAAact=VREF\times(R1act+\Sigma Ractaddx)/Ract0$ where $R1act=Ract0+R2act.$ Here $\Sigma Ractaddx$ signifies a total sum of resistance values of the resistors Ractadd0 to Ractadd3 whose corresponding PMOS switches S20 to S23 are in OFF state.

VAA in the standby state can be trimmed in 16 levels of $VAAstby=VREF\times(R1stby+\Sigma Rstbyaddx)/Rstby0$ where $R1stby=Rstby0+R2stby.$ Here ΣRstbyaddx signifies a total sum of resistance values of the resistors Rstbyadd0 to Ractadd3 whose corresponding PMOS switches S24 to S27 are in OFF state.

Figure 3:
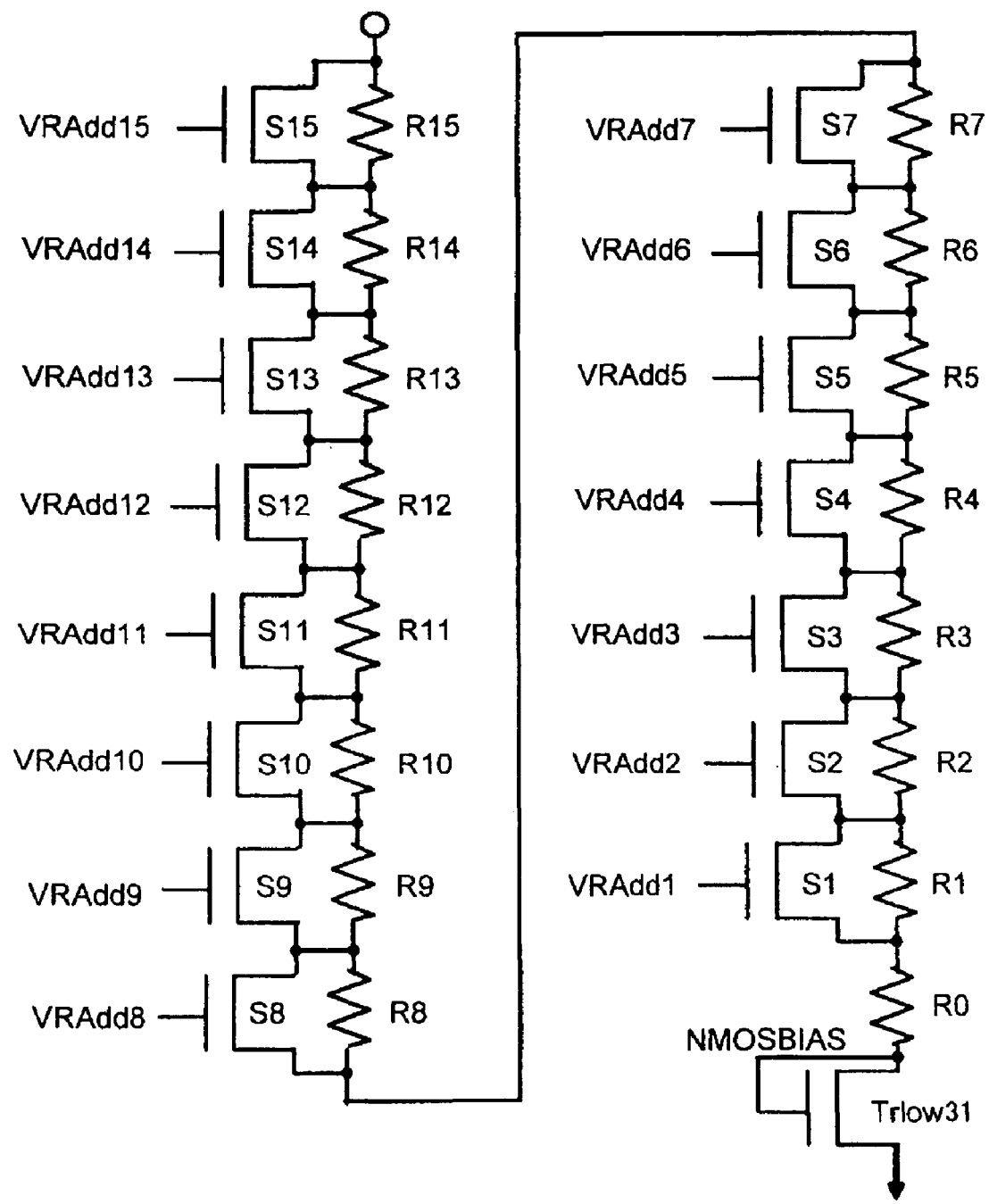
FIG. 3 is a circuit diagram showing a bias generating circuit 12 that generates NMOSBIAS, in the voltage step-down circuit according to the first embodiment.

FIG. 3 is a circuit diagram showing the bias generating circuit 12 for generating NMOSBIAS, in the voltage step-down circuit according to the first embodiment. In the voltage step-down circuit according to the first embodiment, the bias generating circuit 12 is equipped with 16 series-connected resistors R0 to R15, 15 NMOS switches S1 to S15 connected in parallel with R1 to R15 respectively, and a diode-connected NMOS Trlow31.

One end of R15 and VDD are connected to a drain of S15, the other end of R15 and a drain of S14 are connected to a source of S15, and VRAdd15 is connected to a gate of S15. Also, one end of R14 is connected to the drain of S14, the other end of R14 and a drain of S13 are connected to a source of S14, and VRAdd14 is connected to a gate of S14.

One end of R3 is connected to the drain of S3, the other end of R3 and a drain of S2 are connected to a source of S3, and VRAdd3 is connected to a gate of S3. Also, one end of R2 is connected to the drain of S2, the other end of R2 and a drain of S1 are connected to a source of S2, and VRAdd2 is connected to a gate of S2.

One end of R1 is connected to the drain of S1, the other end of R1 and one end of R0 are connected to a source of S1, and VRAdd1 is connected to a gate of S1. Also, a drain and a gate of Trlow31 are connected to the other end of R0, and a source of Trlow31 is connected to GND.

Trlow31 is a Low Vth transistor having a threshold voltage lower than that of ordinary one. The drain of Trlow31 is connected to a gate of Tr2 shown in FIG. 1 as the output NMOSBIAS of the bias circuit 12.

VRAdd1 to VRAdd15 are generated based on the trimming addresses Add.1 to Add.15, and relationships between them are given in following Table.

TABLE 2

| | VRAdd | | | | | | | | | | | | | | |
|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 |
| Add. 1 | Low | High | High | High | High | High | High | High | High | High | High | High | High | High | High |
| Add. 2 | Low | Low | High | High | High | High | High | High | High | High | High | High | High | High | High |
| Add. 3 | Low | Low | Low | High | High | High | High | High | High | High | High | High | High | High | High |
| Add. 4 | Low | Low | Low | Low | High | High | High | High | High | High | High | High | High | High | High |
| Add. 5 | Low | Low | Low | Low | Low | High | High | High | High | High | High | High | High | High | High |
| Add. 6 | Low | Low | Low | Low | Low | Low | High | High | High | High | High | High | High | High | High |
| Add. 7 | Low | Low | Low | Low | Low | Low | Low | High | High | High | High | High | High | High | High |
| Add. 8 | Low | Low | Low | Low | Low | Low | Low | Low | High | High | High | High | High | High | High |
| Add. 9 | Low | Low | Low | Low | Low | Low | Low | Low | Low | High | High | High | High | High | High |
| Add. 10 | Low | Low | Low | Low | Low | Low | Low | Low | Low | Low | High | High | High | High | High |
| Add. 11 | Low | Low | Low | Low | Low | Low | Low | Low | Low | Low | Low | High | High | High | High |
| Add. 12 | Low | Low | Low | Low | Low | Low | Low | Low | Low | Low | Low | Low | High | High | High |
| Add. 13 | Low | Low | Low | Low | Low | Low | Low | Low | Low | Low | Low | Low | Low | High | High |
| Add. 14 | Low | Low | Low | Low | Low | Low | Low | Low | Low | Low | Low | Low | Low | Low | High |
| Add. 15 | Low | Low | Low | Low | Low | Low | Low | Low | Low | Low | Low | Low | Low | Low | Low |

One end of R13 is connected to the drain of S13, the other end of R13 and a drain of S12 are connected to a source of S13, and VRAdd13 is connected to a gate of S13. Also, one end of R12 is connected to the drain of S12, the other end of R12 and a drain of S11 are connected to a source of S12, and VRAdd12 is connected to a gate of S12.

One end of R11 is connected to the drain of S11, the other end of R11 and a drain of S10 are connected to a source of S11, and VRAdd11 is connected to a gate of S11. Also, one end of R10 is connected to the drain of S10, the other end of R10 and a drain of S9 are connected to a source of S10, and VRAdd10 is connected to a gate of S10.

One end of R9 is connected to the drain of S9, the other end of R9 and a drain of S8 are connected to a source of S9, and VRAdd9 is connected to a gate of S9. Also, one end of R8 is connected to the drain of S8, the other end of R8 and a drain of S7 are connected to a source of S8, and VRAdd8 is connected to a gate of S8.

One end of R7 is connected to the drain of S7, the other end of R7 and a drain of S6 are connected to a source of S7, and VRAdd7 is connected to a gate of S7. Also, one end of R6 is connected to the drain of S6, the other end of R6 and a drain of S5 are connected to a source of S6, and VRAdd6 is connected to a gate of S6.

One end of R5 is connected to the drain of S5, the other end of R5 and a drain of S4 are connected to a source of S5, and VRAdd5 is connected to a gate of S5. Also, one end of R4 is connected to the drain of S4, the other end of R4 and a drain of S3 are connected to a source of S4, and VRAdd4 is connected to a gate of S4.

Figure 4:
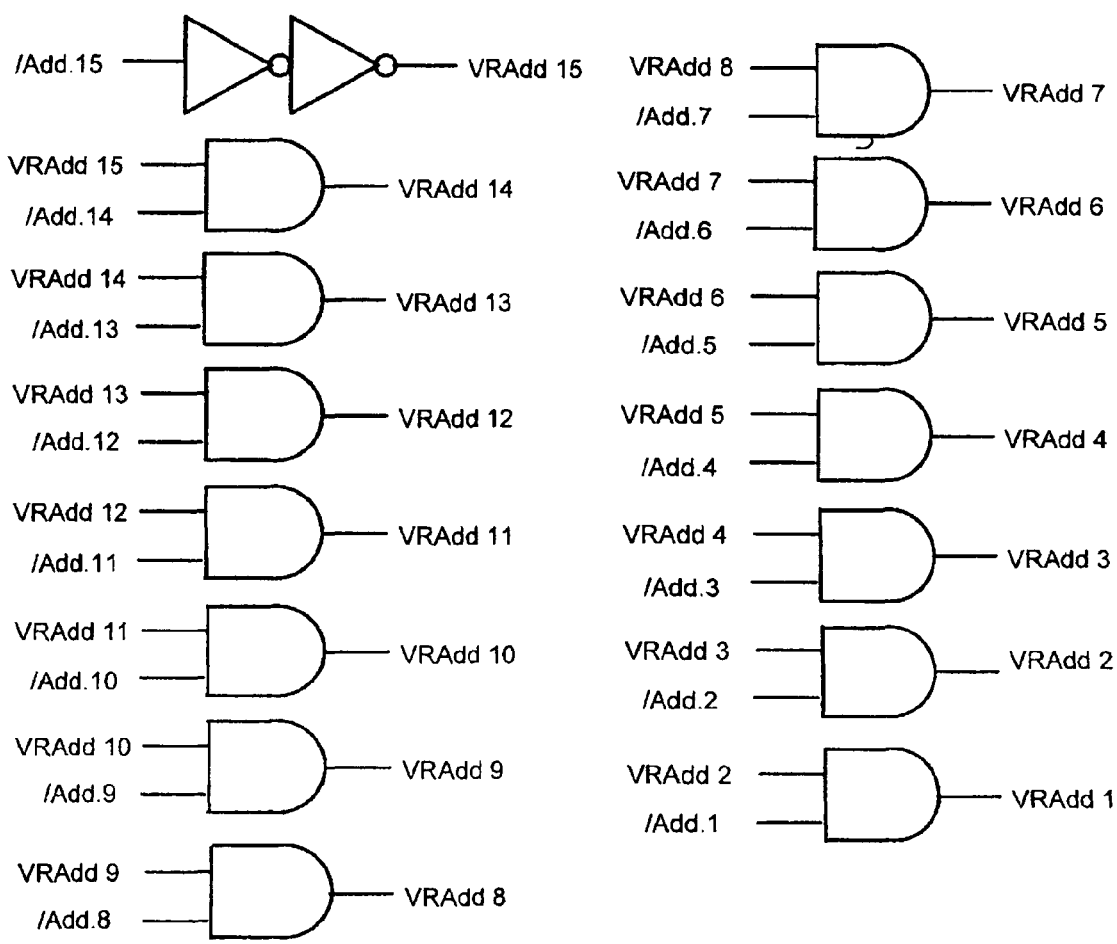
FIG. 4 is a circuit diagram showing an example of a circuit that generates VRAdd1 to VRAdd15, in the voltage step-down circuit according to the first embodiment.

FIG. 4 shows an exemplary circuit for generating VRAdd1 to VRAdd15. VRAdd15 is a complementary signal /Add.15 of Add.15, VRAdd14 is generated by a logical product of VRAdd15 and /Add.14 as a complementary signal of Add.14, VRAdd13 is generated by a logical product of VRAdd14 and /Add.13 as a complementary signal of Add.13, VRAdd12 is generated by a logical product of VRAdd13 and /Add.12 as a complementary signal of Add.12, VRAdd11 is generated by a logical product of VRAdd12 and /Add.11 as a complementary signal of Add.11, VRAdd10 is generated by a logical product of VRAdd11 and /Add.10 as a complementary signal of Add.10, VRAdd9 is generated by a logical product of VRAdd10 and /Add.9 as a complementary signal of Add.9, VRAdd8 is generated by a logical product of VRAdd9 and /Add.8 as a complementary signal of Add.8, VRAdd7 is generated by a logical product of VRAdd8 and /Add.7 as a complementary signal of Add.7, VRAdd6 is generated by a logical product of VRAdd7 and /Add.6 as a complementary signal of Add.6, VRAdd5 is generated by a logical product of VRAdd6 and /Add.5 as a complementary signal of Add.5, VRAdd4 is generated by a logical product of VRAdd5 and /Add.4 as a complementary signal of Add.4, VRAdd3 is generated by a logical product of VRAdd4 and /Add.3 as a complementary signal of Add.3, VRAdd2 is generated by a logical product of VRAdd3 and /Add.2 as a complementary signal of Add.2, VRAdd1 is generated by a logical product of VRAdd2 and /Add.1 as a complementary signal of Add.1.

VRAdd1 to VRAdd15 are input into the gates of S1 to S15 of the monitor circuit 13. Therefore, relationships between the trimming addresses Add.0 to Add.15 and resistance values existing on the current path corresponding to the selected trimming address are given as follows.

TABLE 3

| Trimming Address | Resistance |
|---|---|
| Add.0 | R0 |
| Add.1 | R0 + R1 |
| Add.2 | R0 + R1 + R2 |
| Add.3 | R0 + ... + R3 |
| Add.4 | R0 + ... + R4 |
| Add.5 | R0 + ... + R5 |
| Add.6 | R0 + ... + R6 |
| Add.7 | R0 + ... + R7 |
| Add.8 | R0 + ... + R8 |
| Add.9 | R0 + ... + R9 |
| Add.10 | R0 + ... + R10 |
| Add.11 | R0 + ... + R11 |
| Add.12 | R0 + ... + R12 |
| Add.13 | R0 + ... + R13 |
| Add.14 | R0 + ... + R14 |
| Add.15 | R0 + ... + R15 |

Correspondences between VAdd.0 to VAdd.15 and resistance values are given by $$\text{Add.}x = \Sigma Rx \text{ (x is an integer of } 0 \leq x \leq 15\text{)}$$

where $\Sigma Rx$ signifies a total sum of resistance values of the resistors R0 to Rx, as shown in Table 3.

As a result, a current Ir flowing through the resistors is given by $$Ir = (VDD - LVth)/(\Sigma Rx)$$

where LVth is a pentode threshold voltage of Trlow31.

Figure 5:
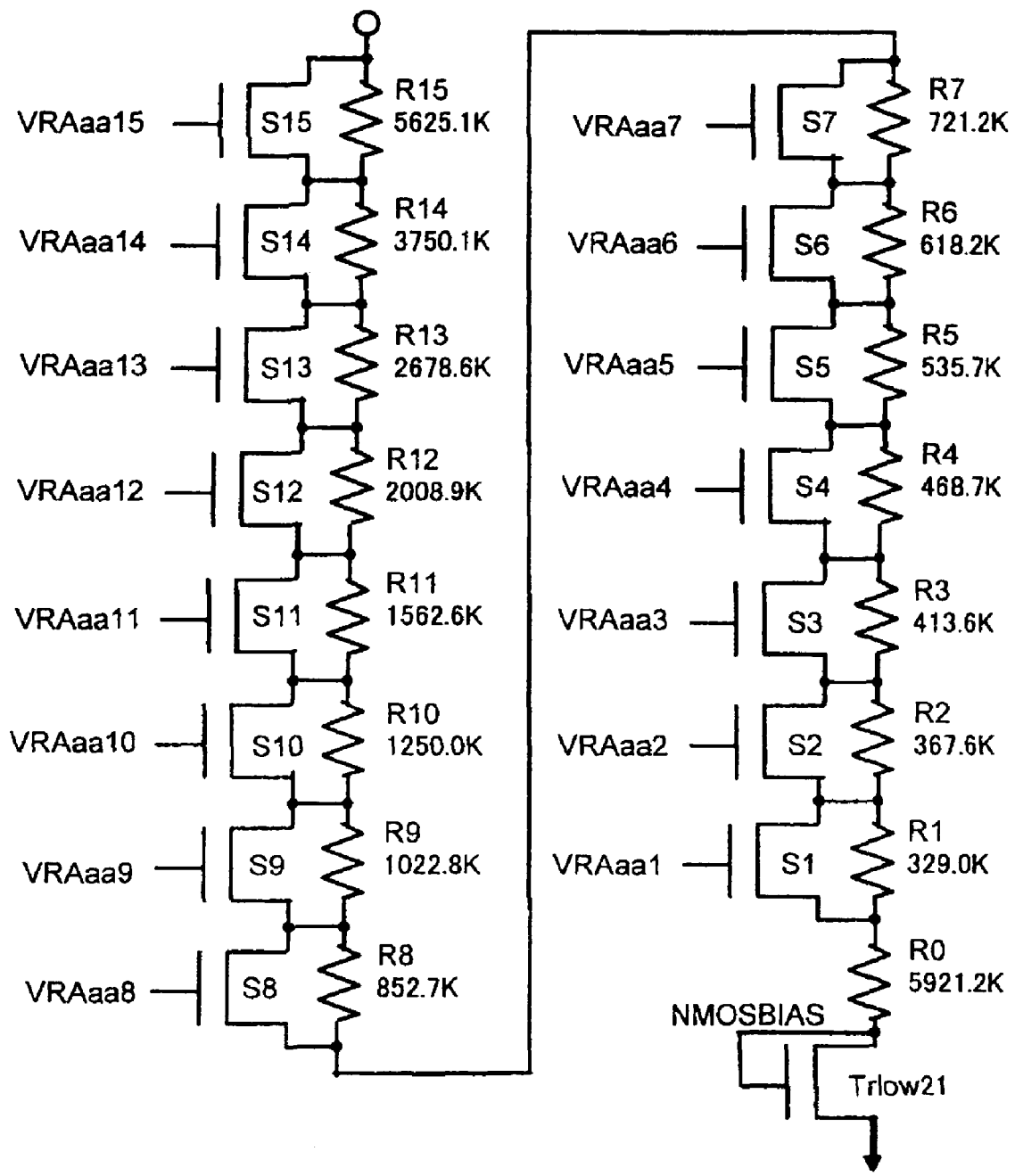
FIG. 5 is a circuit diagram showing exemplary resistance values R0 to R15 of the bias generating circuit 12, in the voltage step-down circuit according to the first embodiment.
Figure 6:
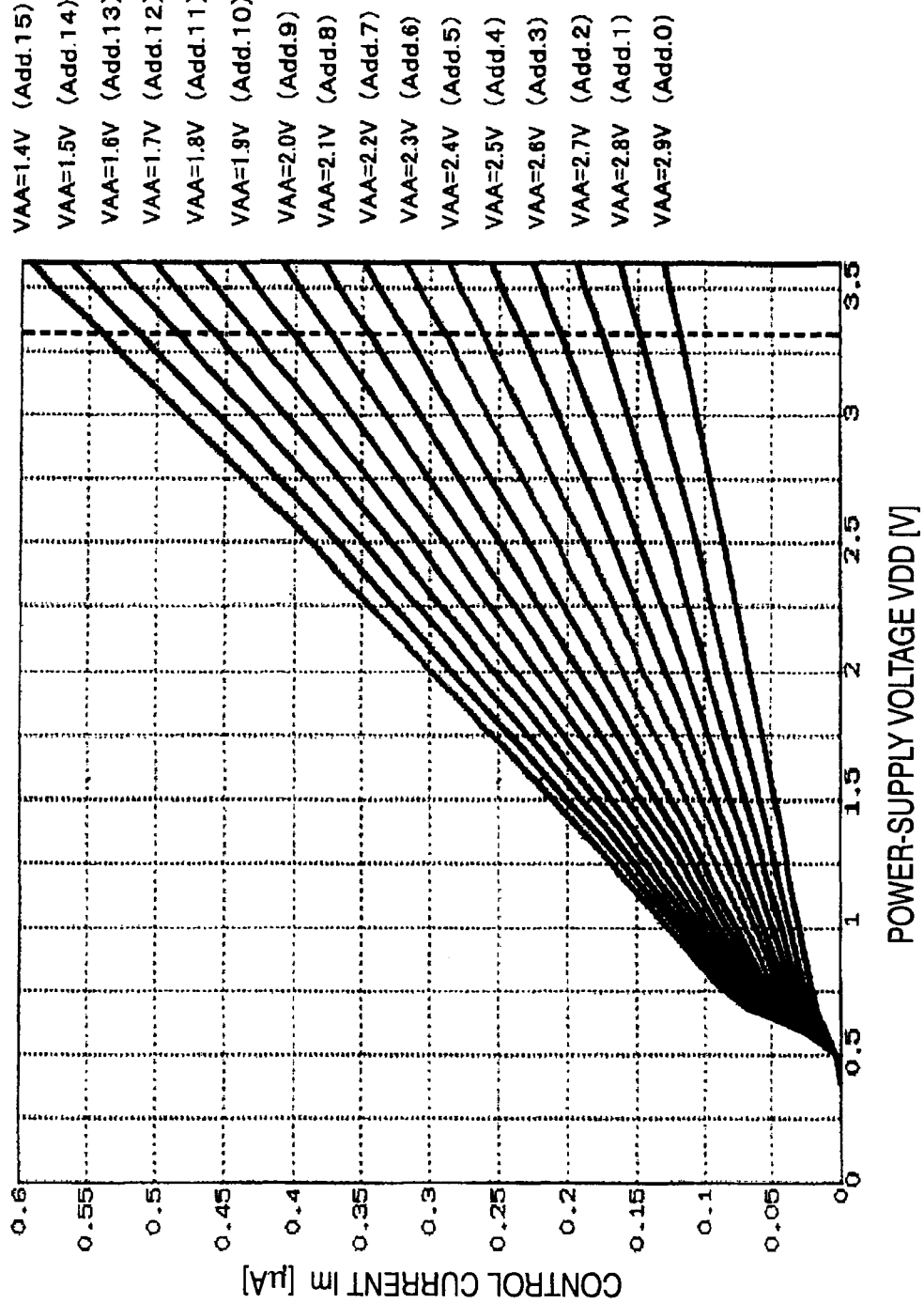
FIG. 6 is a graph showing a simulation result of Im of a current control circuit 11 obtained through a DC-analysis, in the voltage step-down circuit according to the first embodiment.
Figure 7:
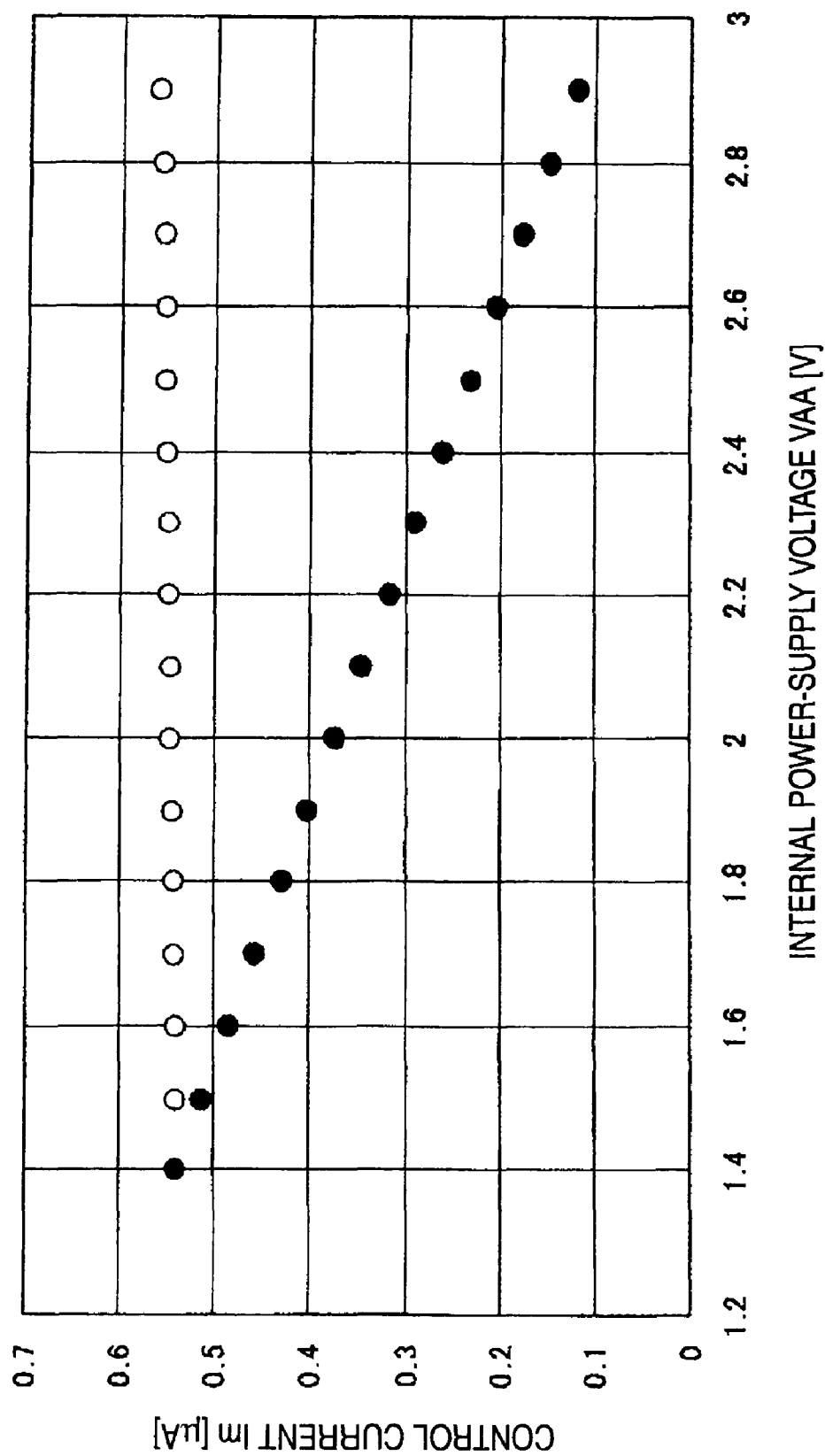
FIG. 7 is a graph showing a simulation result of a VAA dependency of Im at VDD=3.3 V of the current control circuit 11, in the voltage step-down circuit according to the first embodiment.

FIGS. 5 to 7 show exemplary simulation results in the voltage step-down circuit according to the first embodiment. FIG. 5 shows exemplary resistance values R0 to R15 of the bias generating circuit 12, and FIG. 6 and FIG. 7 show the result of simulation done by using the exemplary resistance values in FIG. 5 respectively.

As the resistance values used in the simulation, R0=5921.2 kΩ, R1=329.0 kΩ, R2=367.6 kΩ, R3=413.6 kΩ, R4=468.7 kΩ, R5=535.7 kΩ, R6=618.2 kΩ, R7=721.2 kΩ, R8=852.7 kΩ, R9=1022.8 kΩ, R10=1250.0 kΩ, R11=1562.6 kΩ, R12=2008.9 kΩ, R13=2678.6 kΩ, R14=3750.1 kΩ, and R15=5625.1 kΩ are employed as shown in FIG. 5.

The simulation is done by setting a gate width W=5 μm and a gate length L=5 μm as a size of Trlow31.

FIG. 6 is a graph showing the results obtained by DC-analyzing the control current Im flowing through Tr2 shown in FIG. 1 with respect to Add.0 to Add.15. In FIG. 6, an abscissa denotes the power supply voltage VDD and an ordinate denotes the control current Im, and the internal power supply voltage VAA generated for Add.0 to Add.15 at VDD=3.3 V (indicated with a thick dotted line in FIG. 6) respectively are shown on the right side of the graph.

For example, VAA=2.9 V is generated for Add.0 at VDD=3.3 V, and the control current Im at that time is about 0.12 μA. VAA=1.4 V is generated for Add.15 at VDD=3.3 V, and the control current Im at that time is about 0.54 μA.

FIG. 7 is a graph showing the VAA dependency of Im at VDD=3.3 V. In FIG. 7, an abscissa denotes the internal power supply voltage VAA and an ordinate denotes the control current Im. A black mark "●" shows the control current Im corresponding to each of Add.0 to Add.15. A white mark "○" shows a normalized control current Im' obtained by converting the value of the control current Im shown by the black mark "●" into the value when (VDD−VAA)=(3.3−1.4). Im' is obtained from $$Im' = Im \times (3.3 - 1.4)/(VDD - VAA).$$

It is appreciated from this graph that a linearity of Im to VAA is good and a following expression is satisfied.

$$VDD - VAA(\text{Add.}x) \propto (VDD - LVth)/(\Sigma Rx)$$

where LVth is the threshold value of Trlow31.

In the first embodiment, the bias circuit 12 shown in FIG. 3 generates the current that is proportional to (VDD−VAA) and, then a mirrored current of the generated current is extracted from VAA by Tr2. Since the control current Im is sunk from VAA to GND for a certain period of time after the operating state is switched from the active state to the standby state, a rise of VAA caused due to the switching of the operating state can be suppressed.

Also, according to the first embodiment, the current control circuit 11 sinks the control current Im that is in proportion to (VDD−VAA). Therefore, an increase of VAA caused due to the switching of the operating state can be adequately suppressed when VDD is varied, or when VAA is changed by trimming.

Second Embodiment

Figure 8:
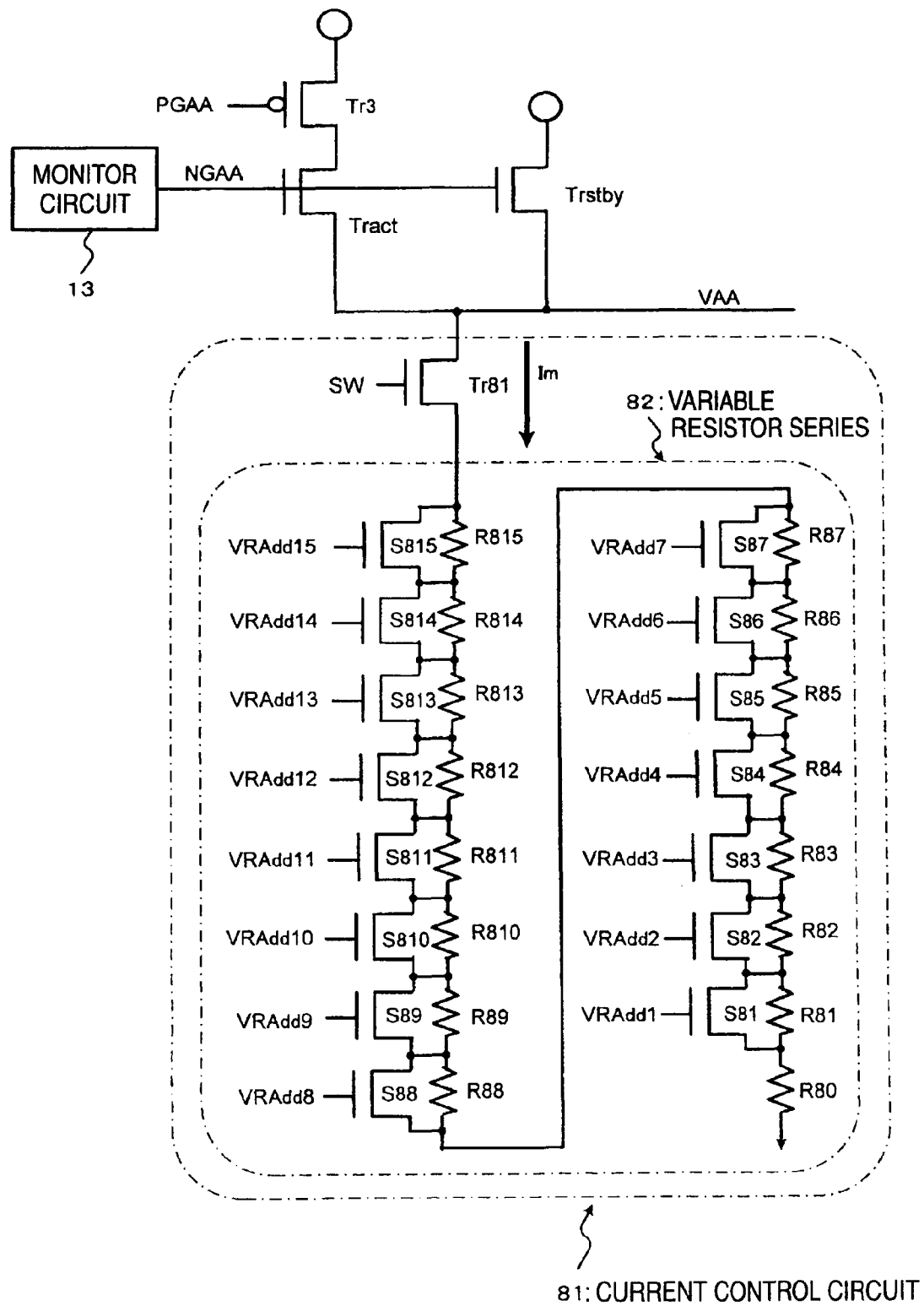
FIG. 8 is a circuit diagram showing a voltage step-down circuit according to a second embodiment.

FIG. 8 is a circuit diagram showing a voltage step-down circuit according to a second embodiment. A voltage step-down circuit according to the second embodiment includes the PMOS Tr3 that is turned ON in the active state, the step-down transistors Tract and Trstby controlled by the control voltage NGAA being input into their gates, the monitor circuit 13 for generating NGAA, and a current control circuit 81 for sinking the control current Im from the internal power supply voltage VAA to GND.

Configurations, functions, and operations of the circuit portions except the current control circuit 81 are similar to those in the first embodiment. Therefore, their detailed explanation will be omitted herein by using the same reference symbols as those in the first embodiment.

As shown in FIG. 8, the current control circuit 81 has an NMOS Tr81 that is turned ON for a certain period of time after the operating state is switched, and a variable resistor series 82 controlled based on the trimming addresses Add.0 to Add.15.

A drain of Tr 81 is connected to VAA as an input of the current control circuit 81, the signal SW indicating the switching of the operating state is connected to a gate of Tr81, and a source of Tr81 is connected to an input of the variable resistor series 82.

The variable resistor series 82 has 16 resistors R80 to R815 connected in series, and 15 NMOS switches S81 to S815 connected in parallel with the resistors R81 to R815 respectively.

One end of R815 and the source of Tr81 are connected to a drain of S815, the other end of R815 and a drain of S814 are connected to a source of S815, and VRAdd15 is connected to a gate of S815. Also, one end of R814 is connected to the drain of S814, the other end of R814 and a drain of S813 are connected to a source of S814, and VRAdd14 is connected to a gate of S814.

One end of R813 is connected to the drain of S813, the other end of R813 and a drain of S812 are connected to a source of S813, and VRAdd13 is connected to a gate of S813. Also, one end of R812 is connected to the drain of S812, the other end of R812 and a drain of S811 are connected to a source of S812, and VRAdd12 is connected to a gate of S812.

One end of R811 is connected to the drain of S811, the other end of R811 and a drain of S810 are connected to a source of S811, and VRAdd11 is connected to a gate of S811. Also, one end of R810 is connected to the drain of S810, the other end of R810 and a drain of S89 are connected to a source of S810, and VRAdd10 is connected to a gate of S810.

One end of R89 is connected to the drain of S89, the other end of R89 and a drain of S88 are connected to a source of S89, and VRAdd9 is connected to a gate of S89. Also, one end of R88 is connected to the drain of S88, the other end of R88 and a drain of S87 are connected to a source of S88, and VRAdd8 is connected to a gate of S88.

One end of R87 is connected to the drain of S87, the other end of R87 and a drain of S86 are connected to a source of S87, and VRAdd7 is connected to a gate of S87. Also, one end of R86 is connected to the drain of S86, the other end of R86 and a drain of S85 are connected to a source of S86, and VRAdd6 is connected to a gate of S86.

One end of R85 is connected to the drain of S85, the other end of R85 and a drain of S84 are connected to a source of S85, and VRAdd5 is connected to a gate of S85. Also, one end of R84 is connected to the drain of S84, the other end of R84 and a drain of S83 are connected to a source of S84, and VRAdd4 is connected to a gate of S84.

One end of R83 is connected to the drain of S83, the other end of R83 and a drain of S82 are connected to a source of S83, and VRAdd3 is connected to a gate of S83. Also, one end of R82 is connected to the drain of S82, the other end of R82 and a drain of S81 are connected to a source of S82, and VRAdd2 is connected to a gate of S82.

One end of R81 is connected to the drain of S81, the other end of R81 and one end of R80 are connected to a source of S81, VRAdd1 is connected to a gate of S81, and the other end of R80 is connected to GND.

VRAdd1 to VRAdd15 applied to control the variable resistor series 82 are similar to those in the first embodiment, and are generated based on the trimming addresses Add.0 to Add.3 to have the relationships shown in Table 2.

3.3 V is widely used as a standard of the power supply voltage VDD. Therefore, in the second embodiment, the control current Im is controlled to satisfy $$Im \propto 3.3 - VAA.$$

In the bias circuit 12 of the first embodiment, the resistor series R0 to R15 and the diode-connected Trlow31 are inserted between VDD and GND in parallel with a current path from VAA to GND, the drain voltage NMOSBIAS of Trlow31 is input into the gate of Tr2 that is in series with the current path, and Im is extracted from VAA through Tr2. Therefore, when VDD is increased, NMOSBIAS is also increased, and then Im to be extracted from VAA is also increased through the mirror coupling between Trlow31 and Tr2.

In the second embodiment, Im is extracted from VAA by using the resistors (R80 to R815) inserted in series with the current path from VAA to GND. In this case, the control of Im is simplified.

In the first embodiment, Rx is set to satisfy $$VDD - VAA(Add.x) \propto (VDD - LVth)/(\Sigma Rx).$$

In the second embodiment, Rx is set to satisfy $$3.3 - VAA(Add.x) \propto 3.3/(\Sigma Rx).$$

According to the second embodiment, the control current Im flows from VAA to GND for a certain period of time after the operating state is switched from the active state to the standby state. As a result, a rise of VAA caused due to the switching of the operating state can be suppressed.

Also, according to the second embodiment, the control current Im is generated by the variable resistor series 82 that is controlled based on the trimming addresses Add.0 to Add.15. As a result, a rise of VAA caused due to the switching of the operating state can be adequately suppressed when VAA is changed by trimming.

Third Embodiment

Figure 9:
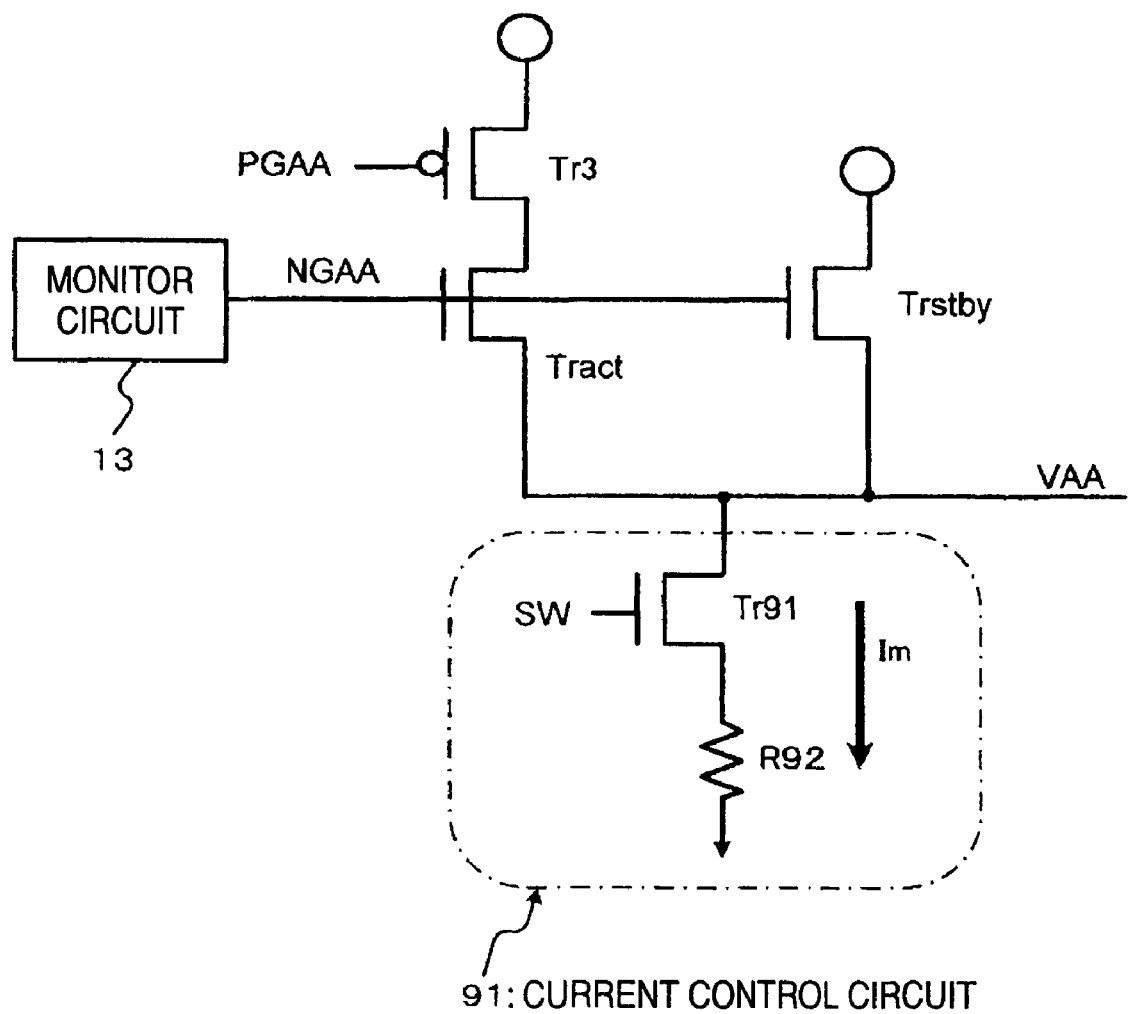
FIG. 9 is a circuit diagram showing a voltage step-down circuit according to a third embodiment.

FIG. 9 is a circuit diagram showing a voltage step-down circuit according to a third embodiment. A voltage step-down circuit according to the third embodiment includes the PMOS Tr3 that is turned ON in the active state, the step-down transistors Tract and Trstby controlled by the control voltage NGAA that is input into their gates, the monitor circuit 13 for generating NGAA, and a current control circuit 91 for sinking the control current Im from the internal power supply voltage VAA to GND.

Configurations, functions, and operations of the circuit portions except the current control circuit 91 are similar to those in the first embodiment. Therefore, their detailed explanation will be omitted herein by using the same reference symbols as those in the first embodiment.

As shown in FIG. 9, the current control circuit 91 has an NMOS Tr91 and a resistor 92. Tr91 is turned ON for a certain period of time after the operating state is switched.

A drain of Tr91 is connected to VAA as an input of the current control circuit 91, the signal SW indicating the switching of the operating state is connected to a gate of Tr91, a source of Tr91 is connected to one end of R92, and the other end of R92 is connected to GND.

In the first and the second embodiments, the control current Im that is proportional to (VDD−VAA) or (3.3-VAA) is sunk. In the third embodiment, Im is not controlled based on the values of VDD and VAA, but a certain amount of Im is extracted from VAA for a certain period of time by Tr91 and R92. As a result, a further simplification of the control can be achieved.

According to the third embodiment, the control current Im is sunk from VAA to GND for a certain period of time after the operating state is switched from the active state to the standby state. Therefore, a rise of VAA caused due to the switching of the operating state can be suppressed.

Also, according to the third embodiment, the control current Im can be generated independent of the voltage values of VDD and VAA. Therefore, a rise of VAA caused due to the switching of the operating state can be suppressed with a simple configuration.

Fourth Embodiment

Figure 10:
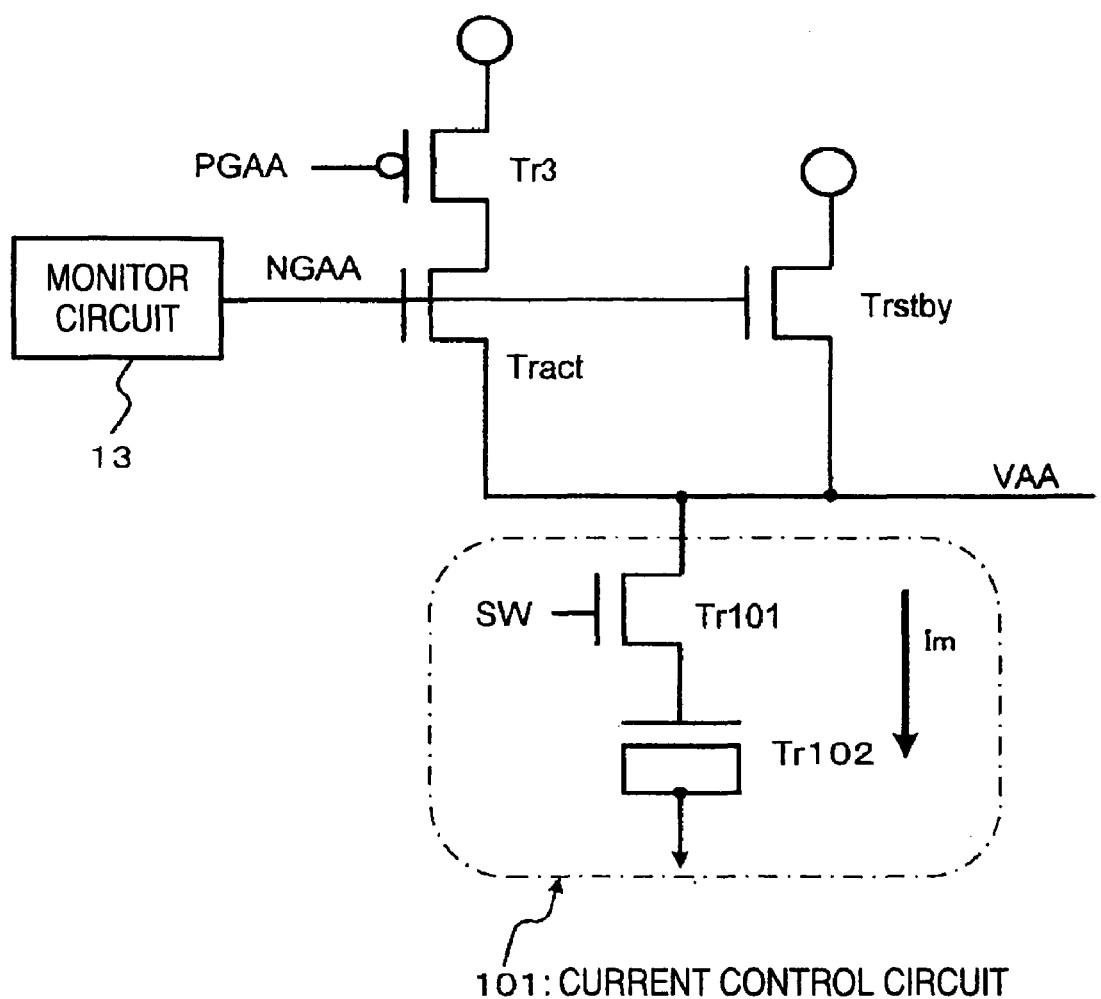
FIG. 10 is a circuit diagram showing a voltage step-down circuit according to a fourth embodiment.

FIG. 10 is a circuit diagram showing a voltage step-down circuit according to a fourth embodiment. A voltage step-down circuit according to the fourth embodiment includes the PMOS Tr3 that is turned ON in the active state, the step-down transistors Tract and Trstby controlled by the control voltage NGAA that is input into their gates, the monitor circuit 13 for generating NGAA, and a current control circuit 101 for sinking the control current Im from the internal power supply voltage VAA to GND.

Configurations, functions, and operations of the circuit portions except the current control circuit 101 are similar to those in the first embodiment. Therefore, their detailed explanation will be omitted herein by using the same reference symbols as those in the first embodiment.

As shown in FIG. 10, the current control circuit 101 has an NMOS Tr101 that is turned ON after the operating state is switched, and a capacitor-connected NMOS Tr102.

A drain of Tr101 is connected to VAA as an input of the current control circuit 101, the signal SW indicating the switching of the operating state is connected to a gate of Tr101, a source of Tr101 is connected to a gate of Tr102, and a drain and a source of Tr102 are connected to GND.

In the fourth embodiment, the control current Im is sunk from VAA to the MOS capacitor (Tr102) for a certain period of time after the operating state is switched from the active state to the standby state, so that a rise of VAA in the standby state is suppressed. Therefore, Im is not sunk further more after the MOS capacitor is fully charged. For example, if a time constant RC that defines an ON time of the SW is increased due to a variation of the resistance value R, amore drop of a voltage of VAA than it is needed can be avoided.

In the current control circuit 101, a plurality of MOS capacitors may be used. The plurality of MOS capacitors may be provided each with a switch so that a total capacitance thereof can be controlled.

According to the fourth embodiment, the control current Im is sunk from VAA to GND for a certain period of time after the operating state is switched from the active state to the standby state. Therefore, a rise of VAA caused due to the switching of the operating state can be suppressed.

Also, according to the fourth embodiment, the control current Im can be generated independent of the voltage values of VDD and VAA. Therefore, a rise of VAA caused due to the switching of the operating state can be suppressed with a simple configuration.

Although the invention has been described with the first to fourth embodiments, it is to be understood that the description and the drawings forming parts of the disclosure do not limit the invention. From the disclosure, various alternative embodiments, examples, and operational arts will be apparent to those skilled in the art.

According to an aspect of the present invention, there is provided a voltage step-down circuit in which a rise of the internal power supply voltage occurred when the operating state is switched is suppressed by sinking a current from the internal power supply voltage for a certain period of time after the operating state is switched.

What is claimed is:

1. A voltage step-down circuit comprising:
   an input terminal to which an external power-supply voltage is input;
   an output terminal from which an internal power-supply voltage that is lower than the external power-supply voltage is output;
   a first PMOS that is connected to the input terminal and is turned ON during an active state and turned OFF during a standby state;
   a first NMOS having:
      a drain that is connected to the input terminal through the first PMOS,
      a gate to which a control voltage is input, and
      a source that is connected to the output terminal;
   a second NMOS having:
      a drain that is connected to the input terminal,
      a gate to which the control voltage is input, and
      a source that is connected to the output terminal; and
   a current control circuit that sinks a control current from the output terminal to a ground level for a certain period of time after an operation state is switched from the active state to the standby state.

2. The voltage step-down circuit according to claim 1, wherein the current control circuit sinks the control current based on a difference between the external and the internal power-supply voltages.

3. The voltage step-down circuit according to claim 1, wherein the current control circuit includes:
   a standard current generation circuit that is connected between the input terminal and the ground level and generates a standard current based on the external power-supply voltage, and
   a current sink circuit that is connected between the output terminal and the ground level and sinks the control current based on the standard current.

4. The voltage step-down circuit according to claim 3, wherein the standard current generation circuit includes:
   a variable resistor that is connected to the input terminal, and
   a fifth NMOS that is connected between the variable resistor and the ground level; and
   wherein the current sink circuit includes:
   a third NMOS that is connected to the output terminal and is turned ON for the certain period of time after the operation state is switched from the active state to the standby state, and
   a fourth NMOS that is connected in series with the third NMOS and is mirror-coupled with the fifth NMOS.

5. The voltage step-down circuit according to claim 4, wherein the third NMOS has:
   a drain that is connected to the output terminal,
   a gate to which a sinking control voltage is input, and
   a source;
   wherein the fourth NMOS has:
   a drain that is connected to the source of the third NMOS,
   a gate, and
   a source that is connected to the ground level; and
   wherein the fifth NMOS has:
   a drain that is connected to the variable resistor and the gate of the fourth NMOS,
   a gate that is connected to the drain, and
   a source that is connected to the ground level.

6. The voltage step-down circuit according to claim 1, wherein the current control circuit includes:
   a third NMOS that is connected to the output terminal and is turned ON for the certain period of time after the operation state is switched from the active state to the standby state, and
   a resistor that is connected between the third NMOS and the ground level.

7. The voltage step-down circuit according to claim 6, wherein the resistor includes a variable resistor.

8. The voltage step-down circuit according to claim 1, wherein the current control circuit includes:
   a third NMOS that is connected to the output terminal and is turned ON for the certain period of time after the operation state is switched from the active state to the standby state, and
   a capacitor that is connected between the third NMOS and the ground level.

9. The voltage step-down circuit according to claim 1 further comprising:
   a control voltage generation circuit that generates the control voltage.

10. The voltage step-down circuit according to claim 1, wherein both of the first NMOS and the second NMOS are operated as a source follower.

11. The voltage step-down circuit according to claim 1, wherein the first NMOS steps-down the external power-supply voltage into the internal power-supply voltage during the active state;
   wherein the second NMOS steps-down the external power-supply voltage into the internal power-supply voltage during both the active state and the standby state; and
   wherein the first NMOS has a size larger than that of the second NMOS.

12. A voltage step-down circuit comprising:
   a first transistor that steps-down an external power-supply voltage into an internal power-supply voltage during an active state;

a second transistor that steps-down the external power-supply voltage into the internal power-supply voltage during an standby state; and a current control circuit that sinks a control current from the internal power-supply voltage to a ground level when an operation state is switched from the active state to the standby state, wherein the current control circuit includes:

a standard current generation circuit that is connected between the external power-supply voltage and the ground level and generates a standard current based on the external power-supply voltage, and a current sink circuit that is connected between the internal power-supply voltage and the ground level and sinks the control current based on the standard current for a certain period of time after the operation state is switched from the active state to the standby state.

* * * * *